(12) United States Patent
Chang et al.

(10) Patent No.: US 9,531,419 B2
(45) Date of Patent: *Dec. 27, 2016

(54) LOOP-THROUGH FOR MULTI-CHIP COMMUNICATION SYSTEMS

(71) Applicant: MaxLinear, Inc., Carlsbad, CA (US)

(72) Inventors: Glenn Chang, Carlsbad, CA (US); Sridhar Ramesh, Carlsbad, CA (US); Curtis Ling, Carlsbad, CA (US)

(73) Assignee: MAXLINEAR, INC., Carlsbad, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/828,687

(22) Filed: Aug. 18, 2015

(65) Prior Publication Data

US 2016/0013824 A1    Jan. 14, 2016

Related U.S. Application Data

(63) Continuation of application No. 14/245,589, filed on Apr. 4, 2014, now Pat. No. 9,124,339.

(Continued)

(51) Int. Cl.
| | | |
|---|---|---|
| *G06F 11/00* | (2006.01) | |
| *G11C 7/00* | (2006.01) | |
| *H04B 1/18* | (2006.01) | |
| *H04B 1/16* | (2006.01) | |
| *G06F 7/00* | (2006.01) | |
| *H01L 25/00* | (2006.01) | |

(Continued)

(52) U.S. Cl.
CPC ........ *H04B 1/18* (2013.01); *G06F 7/00* (2013.01); *H01L 25/00* (2013.01); *H04B 1/10* (2013.01); *H04B 1/16* (2013.01); *H04L 12/2838* (2013.01); *H01L 2924/0002* (2013.01); *H04L 2012/2849* (2013.01)

(58) Field of Classification Search
CPC ......... H04B 1/18; H04B 1/16; H04L 12/2838; H04L 2924/0002; G06F 7/00
USPC ......... 713/168–174, 182–186, 202; 709/206, 709/225, 229, 249, 389; 726/2–8
See application file for complete search history.

(56) References Cited

U.S. PATENT DOCUMENTS

| | | | |
|---|---|---|---|
| 6,483,867 B1 | 11/2002 | Mannermaa | |
| 7,773,967 B2 * | 8/2010 | Smith | H04B 1/30 455/114.1 |

(Continued)

FOREIGN PATENT DOCUMENTS

WO    2009143082    11/2009

*Primary Examiner* — Evans Desrosiers
(74) *Attorney, Agent, or Firm* — McAndrews, Held & Malloy, Ltd.

(57) ABSTRACT

Methods and systems are provided for multi-chip receivers with loop-through feeds. A receiver that comprises plurality of chips may receive one or more input feeds, with each of the chips generating a corresponding output comprising data (e.g., channels) extracted from the one or more input feeds. Only a first chip may handle reception and/or initial processing of the one or more input feeds, with each one of the remaining chips processing a loop-through feed generated in the first chip, in order to generate the corresponding output of that chip. The loop-through feed may be generated based on the one or more input feeds. In this regard, the loop-through feed may comprise at least one of the one or more input feeds that is partially processed in the first one of the plurality of chips.

60 Claims, 5 Drawing Sheets

Related U.S. Application Data

(60) Provisional application No. 61/808,291, filed on Apr. 4, 2013.

(51) Int. Cl.
    *H04L 12/28*     (2006.01)
    *H04B 1/10*     (2006.01)
    *G06F 12/14*     (2006.01)

(56) References Cited

U.S. PATENT DOCUMENTS

| | | |
|---|---|---|
| 8,086,205 B2 * | 12/2011 | Thomas .............. H04B 1/006 370/286 |
| 8,868,960 B2 | 10/2014 | Bergmann et al. |
| 2001/0032283 A1 | 10/2001 | Chen et al. |
| 2011/0116419 A1 | 5/2011 | Cholas et al. |
| 2012/0066545 A1 | 3/2012 | Abe |
| 2013/0243436 A1 | 9/2013 | Kargl et al. |
| 2014/0118372 A1 * | 5/2014 | Hung .............. G09G 3/2096 345/532 |

* cited by examiner

LOOP-THROUGH FOR MULTI-CHIP COMMUNICATION SYSTEMS

CLAIM OF PRIORITY

This patent application a continuation of U.S. patent application Ser. No. 14/245,589, filed Apr. 4, 2014, which in turn makes reference to, claims priority to and claims benefit from U.S. Provisional Patent Application Ser. No. 61/808,291, filed Apr. 4, 2013. Each of the above identified applications is hereby incorporated herein by reference in its entirety.

TECHNICAL FIELD

Aspects of the present application relate to communications. More specifically, certain implementations of the present disclosure relate to methods and systems for loop-through for multi-chip communication systems.

BACKGROUND

Existing methods and systems for supporting communication comprising multiple content elements (e.g., channels) may be overly costly and/or inefficient. Further limitations and disadvantages of conventional and traditional approaches will become apparent to one of skill in the art, through comparison of such approaches with some aspects of the present method and apparatus set forth in the remainder of this disclosure with reference to the drawings.

BRIEF SUMMARY

A system and/or method is provided for loop-through for multi-chip communication systems, substantially as shown in and/or described in connection with at least one of the figures, as set forth more completely in the claims.

These and other advantages, aspects and novel features of the present disclosure, as well as details of illustrated implementation(s) thereof, will be more fully understood from the following description and drawings.

DETAILED DESCRIPTION

Certain example implementations may be found in method and system for non-intrusive noise cancellation in electronic devices, particularly in user-supported devices. As utilized herein the terms "circuits" and "circuitry" refer to physical electronic components ("hardware") and any software and/or firmware ("code") which may configure the hardware, be executed by the hardware, and or otherwise be associated with the hardware. As used herein, for example, a particular processor and memory may comprise a first "circuit" when executing a first plurality of lines of code and may comprise a second "circuit" when executing a second plurality of lines of code. As utilized herein, "and/or" means any one or more of the items in the list joined by "and/or". As an example, "x and/or y" means any element of the three-element set {(x), (y), (x, y)}. As another example, "x, y, and/or z" means any element of the seven-element set {(x), (y), (z), (x, y), (x, z), (y, z), (x, y, z)}. As utilized herein, the terms "block" and "module" refer to functions than can be performed by one or more circuits. As utilized herein, the term "example" means serving as a non-limiting example, instance, or illustration. As utilized herein, the terms "for example" and "e.g.," introduce a list of one or more non-limiting examples, instances, or illustrations. As utilized herein, circuitry is "operable" to perform a function whenever the circuitry comprises the necessary hardware and code (if any is necessary) to perform the function, regardless of whether performance of the function is disabled, or not enabled, by some user-configurable setting.

Figure 1:
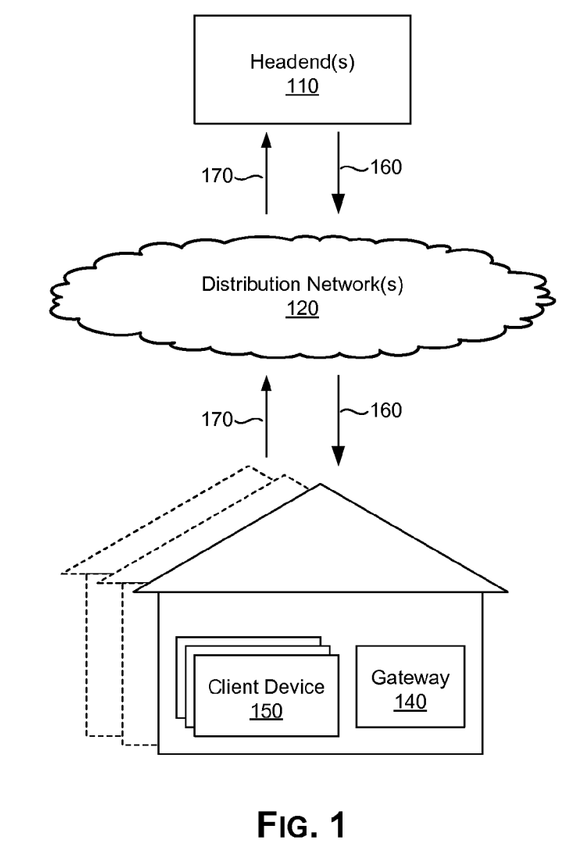
FIG. 1 illustrates an example distribution system, for providing content to a plurality of end-users.

FIG. 1 illustrates an example distribution system, for providing content to a plurality of end-users. Referring to FIG. 1, there is shown a communication system 100 comprising one or more headends 110, a distribution network 120, and one or more end-user locations 130.

The communication system 100 may comprise a plurality of devices (of which the headends 110 and example devices in an example end-user location 130 are shown), and communication resources (of which the distribution network 120 is shown) to enable the devices to communicate with one another, such as via the distribution network 120. The communication system 100 may correspond to a distribution system, which may be used in distributing content and other data. In this regard, the communication system 100 may correspond to a cable distribution network.

Each headend 110 may comprise suitable circuitry for performing headend related functions, such as within a particular distribution topology—e.g., for a particular type of communication setup, using a particular protocol, and/or via particular type(s) of connections. The headend 110 may serve as a master node, being configured for receiving signals (e.g., television signals or other media based signals) from one or more sources, for processing and distribution over a particular distribution system (e.g., a satellite distribution topology, a cable distribution topology, a terrestrial distribution topology, or a combination thereof).

The end-user location 130 may correspond to particular premises (e.g., residential, corporate, commercial, industrial, etc.), in which a local network may be configured to enable providing services within the premises. The services may comprise broadband and/or television (or other similar content broadcasts) access in the premises. Each end-user locations 130 may comprise, for example, at least one gateway 140 and one or more client devices 150.

The gateway 140 may comprise suitable circuitry for providing and/or supporting various services or functions in a particular location (e.g., the end-user location 130), such as to a plurality of client devices (e.g., the client devices 150) present in that location. The gateway 140 may communicate with the client devices 150 over point-to-point or indirect links. The services or functions that may be provided and/or supported by the gateway 140 may pertain to, for example, broadband access, broadcast/television access, content distribution, and the like. In this regard, the gateway 140 may be configured to support reception of signals communicated from external entities (e.g., cable, terrestrial, satellite, and/or IP head-ends), and process the signals as necessary for obtaining data (e.g., content) carried thereby, and outputting the data via corresponding signals over the internal links to the client devices 150. Similarly, the gateway 140 may be operable to receive signals communicated from the client devices 150, over the internal links, and process the signals as necessary for obtaining data and outputting the data via corresponding signals to the external entities. Accordingly, the term "gateway" in this disclosure refers to devices that may perform set-top box (STB) and/or receiver functions (e.g., for satellite, cable, terrestrial television, or the like), over-the-air reception (e.g., DBS satellite dish assembly), WAN/LAN modem functions, or the like. In this regard, "set-top box" or "receiver" functions may comprise functions utilized for delivering data from the head-ends (e.g., cable, satellites, and/or broadband head-ends), web servers, and the like to devices within the premises.

In some instances, at least some of the data utilized in the end-user location 130 may be received from external sources, such as from broadband or broadcast sources (e.g., satellites, the terrestrial TV head-ends, and/or the cable head-ends). In this regard, the gateway 140 may be utilized to service the end-user location 130, such as, for example, by providing to the client devices 150 access to external networks/connections. In such instances, the gateway 140 may facilitate communication of signals between the client devices 150 and the external sources. For example, the gateway 140 may be utilized to route communications between cable head-ends 120 and one or more of client devices 150. In this regard, a client device 150 may receive from the cable head-end 120 streams containing, e.g., multimedia content. In some instances, the interactions with the cable head-end may be bi-directional. For example, client device 150 may transmit to the cable head-end 120 signals or streams, such as those containing user commands or requests (e.g., for particular content) or the like. Communications between client devices and head-ends may be configured in accordance with one or more particular protocol(s). For example, cable communications may be configured in accordance with DOCSIS protocol(s), satellite communications may be configured in accordance with DBS protocol(s), etc.

The client devices 150 may comprise devices which may be operable to utilize services or functions available in a particular location—e.g., those provided by the gateway 140. In this regard, the client devices 150 may be operable to communicate with the gateway 140, such as, for example, via one or more point-to-point links. For example, in instances where the gateway 140 is utilized to support broadband/television access and/or content distribution, the client devices 150 may comprise televisions and similar devices that may be used in consuming (e.g., displaying or playing) content that may be broadcasted (e.g., via terrestrial signals, satellite signals, cable signals, and/or over the Internet) and received via the gateway 140. The disclosure is not limited, however, to any particular type of client device. The links between the gateway 140 and the client devices 150 may comprise, for example, wired, wireless, and/or optical links that may be suited for use in an environment such as the in-premises network. For example, these links may comprise wired connections (e.g., HDMI connections, Display Port links, Multimedia over Coax Alliance (MoCA) links, Ethernet connections, or the like), and/or wireless connections (e.g., Wi-Fi, ZigBee, wireless USB, or the like).

The distribution network 120 may comprise a system of interconnected resources (hardware and/or software), for facilitating exchange and/or forwarding of data (including, e.g., such functions as routing, switching, and the like) among a plurality of nodes (e.g., one or more headends and/or one or more user nodes), based on one or more networking standards. Physical connectivity within, and/or to or from the distribution network 120, may be provided using, for example, copper wires, fiber-optic cables, wireless links (including satellite links), and the like. For example, in instances where the communication system 100 corresponds to a cable distribution system, the distribution network 120 may correspond to coaxial based network, a fiber-optic based network, or a hybrid fibre-coaxial (HFC) based network. In instances where the communication system 100 corresponds to a satellite distribution system, the distribution network 120 may correspond to a plurality of land-based relay stations and a plurality of orbiting satellite nodes. In instances where the communication system 100 may correspond to a terrestrial distribution system, the distribution network 120 may correspond to a plurality of land-based relay stations and a plurality of broadcast towers or antennas.

In operation, the communication system 100 may be used as a distribution system, for enabling distribution of data (e.g., multimedia or other content) to a plurality of end-users (e.g., client devices 150 in end-user locations 130). In this regard, the headend(s) 110 may be configured to receive signals (e.g., television signals or other media based signals) from one or more sources, and process the signals for distribution via communication system 100. The processing may comprise generating downstream signals 160, configured in accordance with the interface(s) and/or standard(s) used within the communication system 100, for communication to the user-end locations 130. For example, in instances where the communication system 100 is a cable distribution system, the headend 110 may generate the downstream signals 160 particularly for communication and/or distribution over coaxial, fiber, or HFC based interconnects. Further, in some instances, the communication system 100 may be configured to support upstream communications. In this regard, the user-end locations 130 may be operable to generate (and the headend 110 may be operable to receive and handle) upstream signals 170. The upstream signals 170 may be used, for example, to convey data (e.g., user generated content), user inputs/commands (e.g., requests for particular content), control data (e.g., status, errors, etc.), and the like.

Accordingly, in some instances, the end-user locations 130 may expect or desire to receive multiple feeds, with each feed comprising a plurality of feed elements (e.g., television channels), with the total number of different feed elements that may be requested being very large (e.g., hundreds of channels). Thus may result in a signification increase in complexity and requirements of the circuitry which may be needed in systems used in the end-user locations 130 to facilitate such reception (particularly the gateway 140). Such complexity, however, may cause unwanted increases in cost and/or operation requirements (e.g., power). Therefore, optimizing reception systems, and operations thereof, may be desirable. Accordingly, in various implementations in accordance with the present disclosure, an optimized architecture may be used in certain communication systems, such as systems used in the end-user locations 130 to facilitate reception of broadcasts and similar communications (e.g., the gateway 140), whereby complexity and operation requirements may be reduced while still providing the maximum expected functionality. Examples of such implementations are described in more detail with respect to the following figures.

Figure 2:
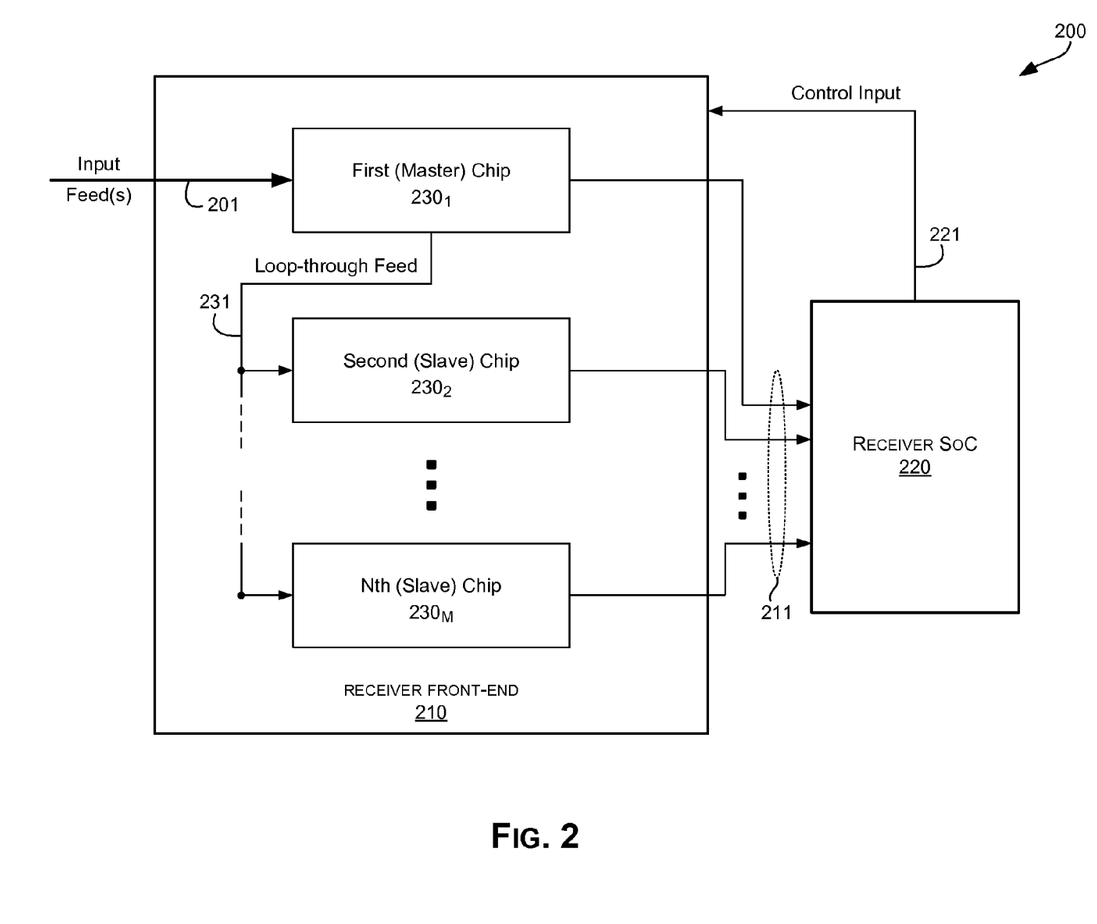
FIG. 2 illustrates an example receiver system incorporating a multi-chip front-end.

FIG. 2 illustrates an example receiver system incorporating multi-chip front-end. Referring to FIG. 2, there is shown a receiver system 200.

The receiver system 200 may comprise suitable circuitry for use in receiving and/or handling broadcasts (e.g., satellite, cable, terrestrial broadcast, broadband, etc.) or similar types of communications. For example, the receiver system 200 may correspond to (at least a portion of) a set-top box, a DBS satellite dish assembly, or the like. The receiver system 200 may correspond to, for example, the gateway 140 of FIG. 1. In an example implementation, the receiver system 200 may comprise a receiver front-end 210 and a receiver system-on-chip (SoC) 220.

The receiver front-end 210 may comprise suitable circuitry for receiving one or more input feeds 201 (e.g., in the form of RF inputs), corresponding to one or more desired broadcasts (e.g., satellite, cable, terrestrial broadcast, broadband, etc.) and processing the received input feeds 201, such as to enable extracting particular feed elements therefrom which may carry desired content. For example, the processing performed in the receiver front-end 210 may comprise extracting channels (e.g., television channels), and/or bands/sub-bands corresponding thereto. The extracted feed elements 211 may be then passed to the receiver SoC 220.

The receiver SoC 220 may comprise suitable circuitry for processing and/or handling the extracted feed elements 211 provided by the receiver front-end 210. The processing and/or handling of the extracted feed elements may be done for the purposes of, for example, distributing data corresponding thereto (e.g., content of the particular channels), such as within an in-premises network (e.g., within the end-user location 130). This may comprise extracting the data (e.g., content), converting or (re)formatting the data for the particular client devices which may be intended for use in consuming (e.g., viewing or playing) the content, and/or processing the data for transmission within the in-premises network (e.g., based on utilized connections, such as for HDMI or MoCA connections).

In some instances, the receiver SoC 220 may provide control input 231 which may be used in configuring and/or adjusting the operations of the receiver front-end 210. For example, the control input 231 may be used to specify requested broadcasts and/or channels, which may be used to adjust the operations of the receiver front-end 210 to ensure that the requested broadcasts and/or channels are obtained and provided to the receiver SoC 220.

In some implementations, the receiver system 200 may incorporate a modular design comprising a multi-chip architecture, whereby a plurality of chips 230, (e.g., silicon chips or "dice") may be used, such as within the receiver front-end 210, to support (and optimize) reception operations. For example, each of the chips 230, may be configured to handle extracting a portion of feed elements of the received broadcasts for which reception is desired (e.g., each chip may be configured to received and/or extract one or more channels). The number of chips may be proportional to would-be-extracted feed elements (e.g., number of channels, which may comprise cable television, satellite television, and/or terrestrial television channels) for which reception is desired.

In some implementations, a multi-chip architecture (e.g., the one used in the receiver system 200) may be optimized, such as by configuring only one of the chips (e.g., chip $230_1$) to control remaining chips and/or to allow offloading to it at least some of the functions that would otherwise be performed in each chip. Such chip may be referred to as a 'master' chip, with the remaining chips (e.g., chips $230_1$-$230_M$) being referred to as 'slave' chips. The offloaded functions may comprise, for example, reception of the input feeds 201 (e.g., circuitry required for terminating the connections used in inputting these feeds) and/or at least some of the initial processing required for reception of the input feeds 201. The initial processing may comprise amplification, analog-to-digital conversion, and the like. Thus, only the first (master) chip $230_1$ would be designed and/or configured to perform these functions, with the remaining chips $230_2$-$230_M$ being configured as 'slave' chips, and lacking those functions (thus mitigating the need for inclusion of circuitry for performing those functions). Further, the remaining (slave) chips $230_2$-$230_M$ would only be used when more feed elements (than can be extracted by the master chip) are requested. In other words, when the first (master) chip $230_1$ is sufficient to obtain desired feed elements, only that chip is used, and other chips are only used when needed to obtain additional desired feed elements. In such situations, the 'master' chip may generate and send to the 'slave' chips an input 231 corresponding to the partially processed feed inputs 201, for handling by the 'slave' chips. This input may be referred to as "loop-through" input. In some instances, the 'master' chip may process the loop-through input 231 to make it suitable for handling by and/or processing in the 'slave' chips, particularly to reduce as much as possible the required processing (and thus circuitry or use of circuitry) needed in each of the 'slave' chips. Accordingly, where such master-slave configuration is used in multi-chip architecture, as much of the functionality (and thus circuitry or use of circuitry) may be put in the 'master' chip with as little functionality (and thus circuitry or use of circuitry) being in the 'slave' chips. An example of multi-chip architecture is described in more detail with respect to the following figures.

Figure 3:
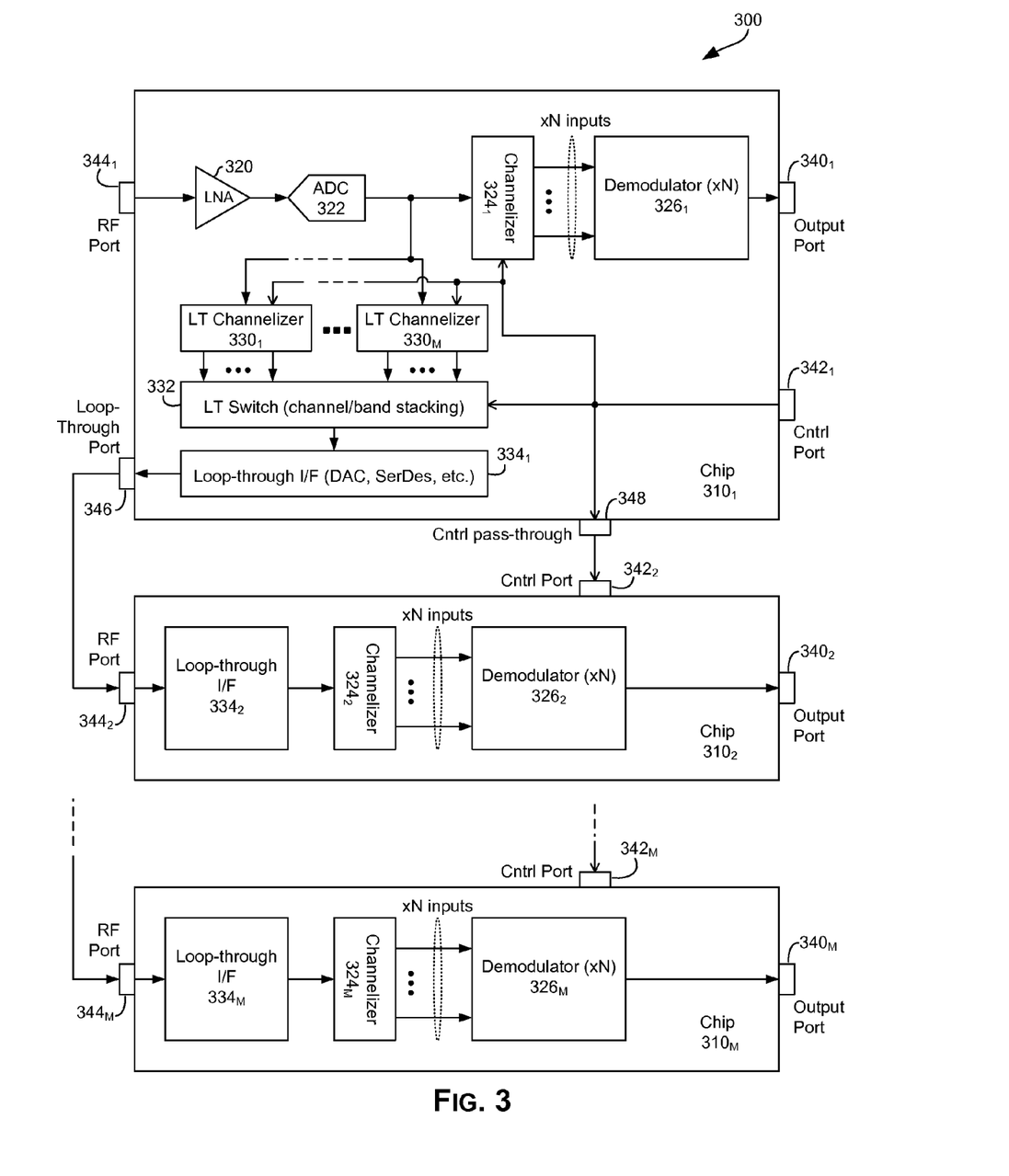
FIG. 3 illustrates an example multi-chip receiver front-end architecture.

FIG. 3 illustrates an example multi-chip receiver front-end architecture. Referring to FIG. 3, there is shown a multi-chip architecture 300.

The multi-chip architecture 300 may correspond to a multi-chip implementation of a receiver front-end, such as the receiver front-end 200 of FIG. 2. In this regard, the multi-chip architecture 300 may be incorporated into a communication system that may be used in receiving and/or handling broadcasts or similar types of communications (e.g., set-top box, DBS satellite dish assembly, and/or the like). In particular, the multi-chip architecture 300 may provide a modular implementation comprising a plurality of chips $310_1$-$310_M$ (e.g., silicon chips or "die") may be used to handle extracting of a plurality of channels (e.g., cable television, satellite television, and/or terrestrial television channels). In this regard, the number of chips (M) may be proportional to the maximum number of channels for which reception may be desired.

For example, as shown in the example implementation depicted in FIG. 3, each chip 310, may be configured to extract and/or handle N channels. In this regard, each of the chips $310_1$-$310_M$ may comprise a corresponding one of N-demodulators $326_1$-$326_M$, each of which may comprise circuitry for demodulating N channels. Thus, where the maximum number of channels requested or desired is greater than N and less than 2N+1, there may be two chips 310, installed (M=2); where the maximum number of channels requested or desired is greater than N and less than 3N+1, there would be three chips 310, installed (M=3); and so on. Each of the chips $310_1$-$310_M$ may be operable to output the channels demodulated thereby (e.g., output of respective one of the N-demodulators $326_1$-$326_M$) out of the multi-chip architecture 300—e.g., to a receiver system-on-chip (SoC), such as via respective one of corresponding output ports $340_1$-$340_M$.

The chips $310_1$-$310_M$ may be configured to support a master-slave scheme, as described with respect to FIG. 2, for example. In this regard, only the first chip $310_1$ may be configured to perform the initial processing function applied to the RF input(s), received via RF input port $344_1$. This allows configuring or implementing the remaining chips $310_2$-$310_M$ to perform reduced functions (e.g., less than the front-end processing offloaded to the master chip $310_1$). For example, only the first chip $310_1$ may comprise circuitry for performing a full-spectrum capture front end and/or for concurrently digitizing the entire spectrum containing all of the channels needed for the chips $310_1$-$310_M$. In this regard, the chip $310_1$ may comprise, for example, a low-noise amplifier 320 and an analog-to-digital convertor (ADC) 322, for performing the full-spectrum capture of the RF inputs, and the digitalization thereof.

The chip $310_1$ may also comprise channelizers $324_1$ and $330_2$-$330_M$ configurable for selecting the channels to be processed from the digitized spectrum. In this regard, only outputs of the channelizer $324_1$ may be processed (e.g., demodulated in the N-demodulator $326_1$) within the chip $310_1$ for outputting out of the multi-chip architecture 300—e.g., via the output port $340_1$. The remaining M−1 channelizers (e.g., the channelizers $330_2$-$330_M$) may be used in generating input to the remaining, slave chips $310_2$-$310_M$. For example, outputs of the additional channelizers $330_2$-$330_M$ in the chip $310_1$ may be output via a loop-through port 346 to the chips $310_2$-$310_M$ (or just chip $310_2$, if M=2), with the loop-through signal(s) being fed into a respective one or ones of RF input ports $344_2$-$344_M$ of the chips $310_2$-$310_M$. This may eliminate the need for RF splitters to feed the input signal to the other, slave chips, and for incorporating processing circuitry required for initial processing functions (e.g., spectrum capture and/or digitization). In an example implementation, each of the M channelizers in the chip $310_1$ (e.g., the channelizers $324_1$ and $330_2$-$330_M$) may select N individual channels (e.g., N satellite, cable, and/or terrestrial television channels).

In another example implementation, the first channelizer (the channelizer $324_1$) may select individual channels while each of the remaining M−1 channelizers (e.g., the channelizers $330_2$-$330_M$) may select sub-bands (e.g., bands of the digitized spectrum containing multiple individual channels) which may then be channelized into individual channels by corresponding one of channelizers $324_2$-$324_M$ residing in the chips $310_2$-$320_M$, with each of the channelizers $324_2$-$324_M$ being substantially similar to the channelizer $324_1$. Such scheme may reduce the power and/or area consumed by channelizers in the chip $310_1$.

In some example implementations, identifying which channels are selected by which channelizers in the M chips may be controlled by one or more control signals from the system-on-chip (SoC) that receives the demodulated channels. For example, each of the chips $310_1$-$310_M$ may comprise a respective control port $342_i$, which may be used to provide control information for use in controlling or adjusting operations of the chips $310_1$-$310_M$. In this regard, in one example implementation, the control input from the SoC may only be provided to the master chip $310_1$, via its control port $342_1$, with the master chip $310_1$ then providing necessary channel selection control inputs to the remaining slave chips $310_1$-$310_M$, via their respective control ports $342_2$-$342_M$. Alternatively, the channel selection input may be provided directly and individually from the SoC to the chips $310_1$-$310_M$, via their respective control ports $342_1$-$342_M$.

In an example implementation, chip $310_1$ may be operable to automatically detect which channels should be selected by one or more channelizers. For example, the chip $310_1$ may auto-select channels based on measured characteristics of the channels of the digitized spectrum (e.g., for terrestrial television where channel quality/availability may depend on location, weather conditions, etc.), based on user subscriptions and/or viewing habits, and/or based on any other suitable parameter(s). In an example implementation, upon automatically selecting a subset of the channels, the chip $310_1$ may construct a lower-resolution, lower frequency, and/or lower bandwidth spectrum for further processing and/or loop-through to other chip(s).

In some example implementations, the selected channels/sub-bands for inclusion in the loop-through output may be "band stacked" (or "channel stacked") for output to chips $310_2$ through $310_M$. For example, the chip $310_1$ may comprise loop-through switch 332, which may comprise circuitry for performing band and/or channel stacking. In this manner, where the selected channels/sub-bands to be looped-through are spaced apart in the digital spectrum, they may be more tightly-packed in the loop-through signal, thus reducing the bandwidth requirements of the loop-through signal. Additionally or alternatively, the selected channels/sub-bands may be placed at different frequencies in the loop-through signal than the frequencies at which they were received by chip $310_1$. For example, the selected channels/bands may be stacked to lower frequencies than their original frequencies thus allowing chips $310_2$ through $310_M$ to operate at lower frequencies (e.g., lower data conversion sample rates).

In some example implementations, prior to stacking, the selected channels/sub-bands may be individually gain controlled such that the peak to average power ratio of the loop-through signal may be set and/or maintained below a desired threshold. Where channels are stacked onto the loop-through signal at frequencies different than they appear in the received RF signals, control information pertinent to the change (e.g., information relating to an updated program guide and/or channel plan) may be conveyed to chips $310_2$ through $310_M$ such that they can select and demodulate the correct channels. In an example implementation, the chip $310_1$ may modify the channel plan according to the stacking performed and convey the modified program guide and/or channel plan to chips $310_2$ through $310_M$ via a digital control bus, for example.

In some example implementations, the loop-through signal may be processed particularly to optimize the loop-through communication between the chips. For example, each of the chips $310_1$-$310_M$ may comprise a loop-through interface block $334_i$, comprising circuitry for processing the loop-through signal as it is transmitted (by the chip 3101) and received (by each of the remaining chips). The interface processing may be based on, for example, digital-to-analog and analog-to-digital conversions. For example, the loop-through interface block $334_1$ in the chip $310_1$ may comprise a digital-to-analog converter (DAC), with the loop-through signal being passed through it, and thus being subjected to digital-to-analog and analog-to-digital conversion, prior to being output to the remaining chips $310_2$-$310_M$. Each of the loop-through interface blocks $334_2$-$334_M$ in the chips $310_2$-$310_M$ may then comprise an analog-to-digital convertor (ADC), to re-digitize the loop-through signal before channelization via the channelizers $324_2$-$324_M$. One advantage of such approach is that an analog loop-through signal output by such a DAC may be useful to the network (e.g., CATV or DBS) operator for testing/troubleshooting purposes.

In another example implementation, the interfacing processing may be based on serialization/de-serialization of the loop-through signal. In this regard, each of the loop-through interface blocks $334_1$-$334_M$ may comprise a serializer/deserializer (SerDes) circuitry. Thus, the loop-through signal may pass through the loop-through interface blocks $334_1$ in the chip $310_1$ to serialize it; and the received loop-through in each of the chips $310_2$-$310_M$ may be passed through loop-through interface blocks $334_2$-$334_M$, to de-serialize the signal before channelization via the channelizers $324_2$-$324_M$. Use of serialization/de-serialization may be desirable because of the relatively narrow bandwidth of the loop-through signal as a result of closely stacking the channels/sub-bands.

Figure 4:
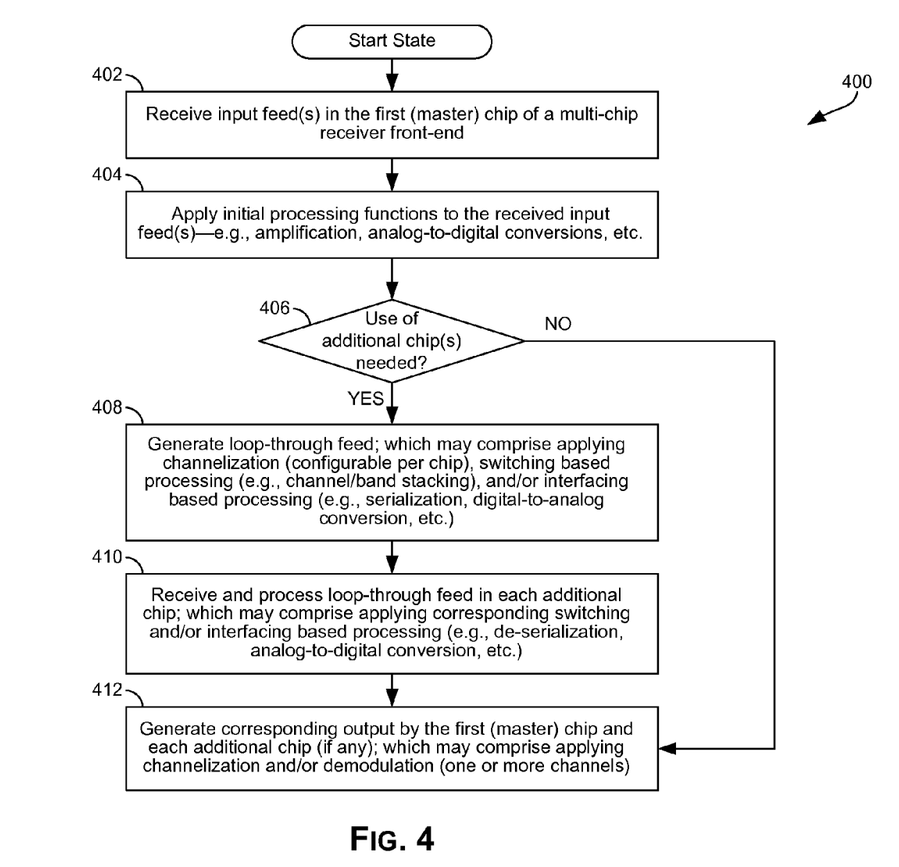
FIG. 4 is a flowchart illustrating an example process for handling input feed(s) in a receiver system incorporating a multi-chip front-end.

FIG. 4 is a flowchart illustrating an example process for handling input feed(s) in a receiver system incorporating a multi-chip front-end. Referring to FIG. 4, there is shown a flow chart 400, comprising a plurality of example steps, which may be executed in a receiver system incorporating a multi-chip front-end (e.g., the receive system 200 of FIG. 2, incorporating a multi-chip architecture such as the architecture 300 of FIG. 3).

In step 402, input feed(s) may be received via a first (master) chip of a multi-chip receiver front-end. In step 404, initial processing functions may be applied, in the first (master) chip to the received input feed(s)—e.g., amplification, analog-to-digital conversions, etc.

In step 406, it may be determined whether there is (or is not) a need for use of other chip(s). The determination may be based on maximum number of feed elements (e.g., television channels) that may be obtained via each chip and the number of feed elements requested (e.g., as indicated via control input from, for example, receiver SoC). This determination may also entail determining the exact number of additional chips that may be required. In instances where no additional chips are needed, the process may skip to step 412; otherwise the process may proceed to step 408.

In step 408, a loop-through feed may be generated in the first (master) chip. Generating the loop-through feed may comprise, for example, applying channelization (configurable per chip—e.g., based on particular feed elements to be obtained by each chip), switching based processing (e.g., channel/band stacking), and/or interfacing based processing (e.g., serialization, digital-to-analog conversion, etc.)

In step 410, the loop-through feed may be received and processed in each additional chip. Processing of the loop-through feed may comprise, for example, applying corresponding switching and/or interfacing based processing (e.g., de-serialization, analog-to-analog conversion, etc.)

In step 412, a corresponding output may be generated by the first (master) chip, and by each additional chip (if any). Generating the corresponding output may comprise, for example, applying channelization and/or demodulation, to obtain one or more particular feed elements (e.g., one or more television channels).

Figure 5:
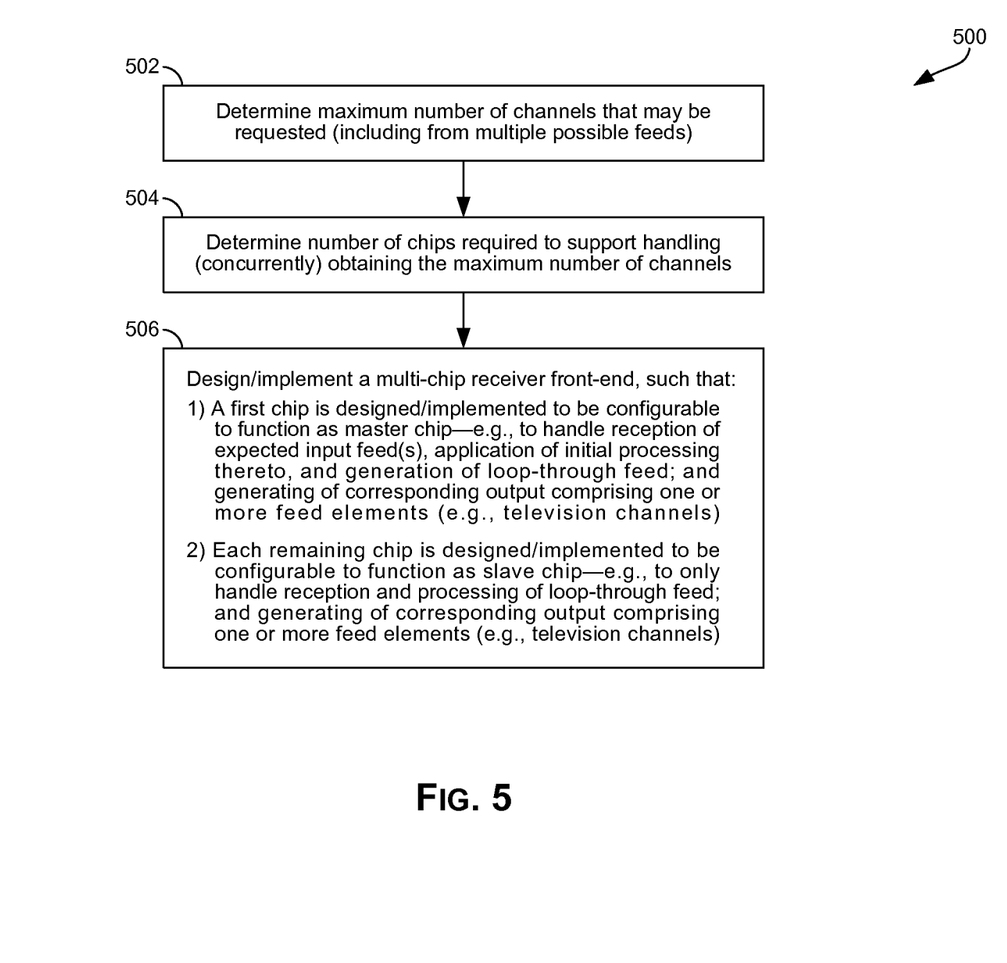
FIG. 5 is a flowchart illustrating an example process for implementing a receiver system that incorporates a multi-chip front-end architecture.

FIG. 5 is a flowchart illustrating an example process for implementing a receiver system that incorporates a multi-chip front-end architecture. Referring to FIG. 5, there is shown a flow chart 500, comprising a plurality of example steps, which may be executed when designing and/or implementing a receiver system incorporating a multi-chip architecture for use in reception operations (e.g., the receive system 200 of FIG. 2, incorporating a multi-chip architecture such as the architecture 300 of FIG. 3).

In step 502, a maximum number of feed elements (e.g., channels) that may be requested (including from multiple possible feeds) may be determined. For example, if it anticipated that at most, three different input feeds (e.g., cable, satellite, and terrestrial) may be received, with each input feed comprising up to X channels, the maximum number of channels that may be requested may be 3X.

In step 504, the number of chips required to support handling (including concurrently) obtaining the maximum number of channels may be determined. For example, if each chip is to handle N channels (which may be, itself, determined by pertinent design or implementation considerations, such the number of channelizers and/or demodulators that can be incorporated into each chip), the number of chips needed may be X/N (or at least 1, if X=<N).

In step 506, a multi-chip receiver front-end may be designed and/or implemented, based on the determined number of chips. For example, a first chip in such a multi-chip receiver front-end may be designed and/or implemented to be configurable to function as a master chip—e.g., to handle reception of expected input feed(s), application of initial processing thereto, and generation of loop-through feed; and generating of a corresponding output comprising one or more feed elements. Further, each remaining chip may then be designed and/or implemented to be configurable to function as slave chip—e.g., to only handle reception and processing of a loop-through feed; and generating of corresponding output comprising one or more feed elements (e.g., television channels).

Other implementations may provide a non-transitory computer readable medium and/or storage medium, and/or a non-transitory machine readable medium and/or storage medium, having stored thereon, a machine code and/or a computer program having at least one code section executable by a machine and/or a computer, thereby causing the machine and/or computer to perform the steps as described herein for non-intrusive noise cancelation.

Accordingly, the present method and/or system may be realized in hardware, software, or a combination of hardware and software. The present method and/or system may be realized in a centralized fashion in at least one computer system, or in a distributed fashion where different elements are spread across several interconnected computer systems. Any kind of computer system or other system adapted for carrying out the methods described herein is suited. A typical combination of hardware and software may be a general-purpose computer system with a computer program that, when being loaded and executed, controls the computer system such that it carries out the methods described herein. Another typical implementation may comprise an application specific integrated circuit or chip.

The present method and/or system may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form. Accordingly, some implementations may comprise a non-transitory machine-readable (e.g., computer readable) medium (e.g., FLASH drive, optical disk, magnetic storage disk, or the like) having stored thereon one or more lines of code executable by a machine, thereby causing the machine to perform processes as described herein.

While the present method and/or system has been described with reference to certain implementations, it will be understood by those skilled in the art that various changes may be made and equivalents may be substituted without departing from the scope of the present method and/or system. In addition, many modifications may be made to adapt a particular situation or material to the teachings of the present disclosure without departing from its scope. Therefore, it is intended that the present method and/or system not be limited to the particular implementations disclosed, but that the present method and/or system will include all implementations falling within the scope of the appended claims.

What is claimed:

1. A system, comprising:
   receiver circuitry comprising a plurality of chips, wherein:
      each one of the plurality of chips is operable to generate a corresponding output based on one or more input feeds into said receiver circuitry;
      only a first one of the plurality of chips is operable to:
         handle reception and/or initial processing of the one or more input feeds; and
         generate a loop-through feed based on the one or more input feeds, wherein said loop-through feed comprises at least one of the one or more input feeds that is partially processed in said first one of the plurality of chips; and
      each one of a remaining one or more of the plurality of chips is operable to process said loop-through feed to generate the corresponding output of said each one of said remaining one or more of the plurality of chips;
      the one or more input feeds comprise a cable based feed, a satellite based feed, a terrestrial based feed, and/or a broadband based feed; and
      the outputs generated by the plurality of chips based on the one or more input feeds comprise data corresponding to one or more channels.

2. The system of claim 1, wherein each one of the plurality of chips is operable to generate the corresponding output by applying one or more of channelization and/or demodulation.

3. The system of claim 2, wherein the channelization and/or demodulation are configured in each one of the plurality of chips to obtain particular data associated with the each one of the plurality of chips.

4. The system of claim 1, wherein the initial processing of the one or more input feeds comprises applying one or both of amplification and analog-to-digital conversion.

5. The system of claim 1, wherein said first one of the plurality of chips is operable to generate said loop-through feed by applying one or more of:
   channelization corresponding to the each one of said remaining one or more of the plurality of chips;
   loop-through switching based processing; and
   loop-through interfacing based processing.

6. The system of claim 5, wherein said first one of the plurality of chips is operable to apply said channelization to obtain particular data in said one or more input feeds associated with the each one of said remaining one or more of the plurality of chips.

7. The system of claim 5, wherein said loop-through switching based processing comprises applying channel and/or band stacking.

8. The system of claim 5, wherein said loop-through interfacing based processing comprises applying digital-to-analog conversion and/or serialization.

9. The system of claim 5, wherein each one of said remaining one or more of the plurality of chips is operable to process said loop-through feed by applying loop-through interfacing based processing corresponding to said loop-through interfacing based processing applied by said first one of the plurality of chips.

10. A method, comprising:
    in receiver circuitry that comprises a plurality of chips:
       receiving one or more input feeds via a first one of the plurality of chips;
       handling in said first one of the plurality of chips initial processing input feeds;
       generating in said first one of the plurality of chips, a loop-through feed based on the one or more input feeds, said loop-through feed comprising at least one of the one or more input feeds that is partially processed in said first one of the plurality of chips;
       processing in each one of a remaining one or more of the plurality of chips said loop-through feed; and
       generating in each one of the plurality of chips a corresponding output, wherein:
          said first one of the plurality of chips generated its corresponding output based on processing of said one or more input feeds; and
          each one of said remaining one or more of the plurality of chips generates its corresponding output based on processing of said loop-through feed;
    wherein:
       the one or more input feeds comprise a cable based feed, a satellite based feed, a terrestrial based feed, and/or a broadband based feed; and
       the corresponding output generated by each one of the plurality of chips comprises data corresponding to one or more channels.

11. The method of claim 10, comprising applying in each one of the plurality of chips, when generating its corresponding output, one or more of channelization and/or demodulation.

12. The method of claim 11, wherein the channelization and/or demodulation are configured in the each one of the plurality of chips to obtain particular data associated with the each one of the plurality of chips.

13. The method of claim 10, comprising applying in said first one of the plurality of chips, during said initial processing of the one or more input feeds, one or both of amplification and analog-to-digital conversion.

14. The method of claim 10, comprising applying in said first one of the plurality of chips, during said generating of said loop-through feed, one or more of:
    channelization corresponding to the each one of said remaining one or more of the plurality of chips;
    loop-through switching based processing; and
    loop-through interfacing based processing.

15. The method of claim 14, comprising applying said channelization to obtain particular data in said one or more input feeds associated with each one of said remaining one or more of the plurality of chips.

16. The method of claim 14, comprising applying, during said loop-through switching based processing, channel and/or band stacking.

17. The method of claim 14, comprising applying, during said loop-through interfacing based processing, digital-to-analog conversion and/or serialization.

18. The method of claim 14, comprising applying in the each one of said remaining one or more of the plurality of chips, during said processing of said loop-through feed, loop-through interfacing corresponding to said loop-through interfacing based processing applied in said first one of the plurality of chips.

19. A system, comprising:
receiver circuitry comprising a plurality of chips, wherein:
each one of the plurality of chips is operable to generate a corresponding output based on one or more input feeds into said receiver circuitry;
only a first one of the plurality of chips is operable to:
handle reception and/or initial processing of the one or more input feeds; and
generate a loop-through feed based on the one or more input feeds, wherein said loop-through feed comprises at least one of the one or more input feeds that is partially processed in said first one of the plurality of chips;
each one of a remaining one or more of the plurality of chips is operable to process said loop-through feed to generate the corresponding output of said each one of said remaining one or more of the plurality of chips; and
each one of the plurality of chips is operable to generate the corresponding output by applying one or more of channelization and/or demodulation.

20. The system of claim 19, wherein the channelization and/or demodulation are configured in each one of the plurality of chips to obtain particular data associated with the each one of the plurality of chips.

21. The system of claim 19, wherein the initial processing of the one or more input feeds comprises applying one or both of amplification and analog-to-digital conversion.

22. The system of claim 19, wherein said first one of the plurality of chips is operable to generate said loop-through feed by applying one or more of:
channelization corresponding to the each one of said remaining one or more of the plurality of chips;
loop-through switching based processing; and
loop-through interfacing based processing.

23. The system of claim 22, wherein said first one of the plurality of chips is operable to apply said channelization to obtain particular data in said one or more input feeds associated with the each one of said remaining one or more of the plurality of chips.

24. The system of claim 22, wherein said loop-through switching based processing comprises applying channel and/or band stacking.

25. The system of claim 22, wherein said loop-through interfacing based processing comprises applying digital-to-analog conversion and/or serialization.

26. The system of claim 22, wherein each one of said remaining one or more of the plurality of chips is operable to process said loop-through feed by applying loop-through interfacing based processing corresponding to said loop-through interfacing based processing applied by said first one of the plurality of chips.

27. A method, comprising:
in receiver circuitry that comprises a plurality of chips:
receiving one or more input feeds via a first one of the plurality of chips;
handling in said first one of the plurality of chips initial processing input feeds;
generating in said first one of the plurality of chips, a loop-through feed based on the one or more input feeds, said loop-through feed comprising at least one of the one or more input feeds that is partially processed in said first one of the plurality of chips;
processing in each one of a remaining one or more of the plurality of chips said loop-through feed;
generating in each one of the plurality of chips a corresponding output, wherein:
said first one of the plurality of chips generated its corresponding output based on processing of said one or more input feeds; and
each one of said remaining one or more of the plurality of chips generates its corresponding output based on processing of said loop-through feed; and
applying in each one of the plurality of chips, during said generating its corresponding output, one or more of channelization and/or demodulation.

28. The method of claim 27, wherein the channelization and/or demodulation are configured in the each one of the plurality of chips to obtain particular data associated with the each one of the plurality of chips.

29. The method of claim 27, comprising applying in said first one of the plurality of chips, during said initial processing of the one or more input feeds, one or both of amplification and analog-to-digital conversion.

30. The method of claim 27, comprising applying in said first one of the plurality of chips, during said generating of said loop-through feed, one or more of:
channelization corresponding to the each one of said remaining one or more of the plurality of chips;
loop-through switching based processing; and
loop-through interfacing based processing.

31. The method of claim 30, comprising applying said channelization to obtain particular data in said one or more input feeds associated with each one of said remaining one or more of the plurality of chips.

32. The method of claim 30, comprising applying, during said loop-through switching based processing, channel and/or band stacking.

33. The method of claim 30, comprising applying, during said loop-through interfacing based processing, digital-to-analog conversion and/or serialization.

34. The method of claim 30, comprising applying in the each one of said remaining one or more of the plurality of chips, during said processing of said loop-through feed, loop-through interfacing corresponding to said loop-through interfacing based processing applied in said first one of the plurality of chips.

35. A system, comprising:
receiver circuitry comprising a plurality of chips, wherein:
each one of the plurality of chips is operable to generate a corresponding output based on one or more input feeds into said receiver circuitry;
only a first one of the plurality of chips is operable to:
handle reception and/or initial processing of the one or more input feeds; and
generate a loop-through feed based on the one or more input feeds, wherein said loop-through feed comprises at least one of the one or more input feeds that is partially processed in said first one of the plurality of chips;
each one of a remaining one or more of the plurality of chips is operable to process said loop-through feed to generate the corresponding output of said each one of said remaining one or more of the plurality of chips; and the initial processing of the one or more input feeds comprises applying one or both of amplification and analog-to-digital conversion.

36. The system of claim 35, wherein:
each one of the plurality of chips is operable to generate the corresponding output by applying one or more of channelization and/or demodulation; and
the channelization and/or demodulation are configured in each one of the plurality of chips to obtain particular data associated with the each one of the plurality of chips.

37. The system of claim 35, wherein said first one of the plurality of chips is operable to generate said loop-through feed by applying one or more of:
channelization corresponding to the each one of said remaining one or more of the plurality of chips;
loop-through switching based processing; and
loop-through interfacing based processing.

38. The system of claim 37, wherein said first one of the plurality of chips is operable to apply said channelization to obtain particular data in said one or more input feeds associated with the each one of said remaining one or more of the plurality of chips.

39. The system of claim 37, wherein said loop-through switching based processing comprises applying channel and/or band stacking.

40. The system of claim 37, wherein said loop-through interfacing based processing comprises applying digital-to-analog conversion and/or serialization.

41. The system of claim 37, wherein each one of said remaining one or more of the plurality of chips is operable to process said loop-through feed by applying loop-through interfacing based processing corresponding to said loop-through interfacing based processing applied by said first one of the plurality of chips.

42. A method, comprising:
in receiver circuitry that comprises a plurality of chips:
receiving one or more input feeds via a first one of the plurality of chips;
handling in said first one of the plurality of chips initial processing input feeds;
generating in said first one of the plurality of chips, a loop-through feed based on the one or more input feeds, said loop-through feed comprising at least one of the one or more input feeds that is partially processed in said first one of the plurality of chips;
processing in each one of a remaining one or more of the plurality of chips said loop-through feed;
generating in each one of the plurality of chips a corresponding output, wherein:
said first one of the plurality of chips generated its corresponding output based on processing of said one or more input feeds; and
each one of said remaining one or more of the plurality of chips generates its corresponding output based on processing of said loop-through feed;
applying in said first one of the plurality of chips, during said initial processing of the one or more input feeds, one or both of amplification and analog-to-digital conversion.

43. The method of claim 42, comprising applying in each one of the plurality of chips, when generating its corresponding output, one or more of channelization and/or demodulation, wherein the channelization and/or demodulation are configured in the each one of the plurality of chips to obtain particular data associated with the each one of the plurality of chips.

44. The method of claim 42, comprising applying in said first one of the plurality of chips, during said generating of said loop-through feed, one or more of:
channelization corresponding to the each one of said remaining one or more of the plurality of chips;
loop-through switching based processing; and
loop-through interfacing based processing.

45. The method of claim 44, comprising applying said channelization to obtain particular data in said one or more input feeds associated with each one of said remaining one or more of the plurality of chips.

46. The method of claim 44, comprising applying, during said loop-through switching based processing, channel and/or band stacking.

47. The method of claim 44, comprising applying, during said loop-through interfacing based processing, digital-to-analog conversion and/or serialization.

48. The method of claim 44, comprising applying in the each one of said remaining one or more of the plurality of chips, during said processing of said loop-through feed, loop-through interfacing corresponding to said loop-through interfacing based processing applied in said first one of the plurality of chips.

49. A system, comprising:
receiver circuitry comprising a plurality of chips, wherein:
each one of the plurality of chips is operable to generate a corresponding output based on one or more input feeds into said receiver circuitry;
only a first one of the plurality of chips is operable to:
handle reception and/or initial processing of the one or more input feeds; and
generate a loop-through feed based on the one or more input feeds, wherein said loop-through feed comprises at least one of the one or more input feeds that is partially processed in said first one of the plurality of chips;
each one of a remaining one or more of the plurality of chips is operable to process said loop-through feed to generate the corresponding output of said each one of said remaining one or more of the plurality of chips; and
said first one of the plurality of chips is operable to generate said loop-through feed by applying one or more of:
channelization corresponding to the each one of said remaining one or more of the plurality of chips;
loop-through switching based processing; and
loop-through interfacing based processing.

50. The system of claim 49, wherein:
each one of the plurality of chips is operable to generate the corresponding output by applying one or more of channelization and/or demodulation; and
the channelization and/or demodulation are configured in each one of the plurality of chips to obtain particular data associated with the each one of the plurality of chips.

51. The system of claim 49, wherein said first one of the plurality of chips is operable to apply said channelization to obtain particular data in said one or more input feeds associated with the each one of said remaining one or more of the plurality of chips.

52. The system of claim 49, wherein said loop-through switching based processing comprises applying channel and/or band stacking.

53. The system of claim 49, wherein said loop-through interfacing based processing comprises applying digital-to-analog conversion and/or serialization.

54. The system of claim 49, wherein each one of said remaining one or more of the plurality of chips is operable to process said loop-through feed by applying loop-through interfacing based processing corresponding to said loop-through interfacing based processing applied by said first one of the plurality of chips.

55. A method, comprising:
in receiver circuitry that comprises a plurality of chips:
receiving one or more input feeds via a first one of the plurality of chips;
handling in said first one of the plurality of chips initial processing input feeds;
generating in said first one of the plurality of chips, a loop-through feed based on the one or more input feeds, said loop-through feed comprising at least one of the one or more input feeds that is partially processed in said first one of the plurality of chips;
processing in each one of a remaining one or more of the plurality of chips said loop-through feed;
generating in each one of the plurality of chips a corresponding output, wherein:
said first one of the plurality of chips generated its corresponding output based on processing of said one or more input feeds; and
each one of said remaining one or more of the plurality of chips generates its corresponding output based on processing of said loop-through feed; and
applying in said first one of the plurality of chips, during said generating of said loop-through feed, one or more of:
channelization corresponding to the each one of said remaining one or more of the plurality of chips;
loop-through switching based processing; and
loop-through interfacing based processing.

56. The method of claim 55, comprising applying in each one of the plurality of chips, when generating its corresponding output, one or more of channelization and/or demodulation, wherein the channelization and/or demodulation are configured in the each one of the plurality of chips to obtain particular data associated with the each one of the plurality of chips.

57. The method of claim 55, comprising applying said channelization to obtain particular data in said one or more input feeds associated with each one of said remaining one or more of the plurality of chips.

58. The method of claim 55, comprising applying, during said loop-through switching based processing, channel and/or band stacking.

59. The method of claim 55, comprising applying, during said loop-through interfacing based processing, digital-to-analog conversion and/or serialization.

60. The method of claim 55, comprising applying in the each one of said remaining one or more of the plurality of chips, during said processing of said loop-through feed, loop-through interfacing corresponding to said loop-through interfacing based processing applied in said first one of the plurality of chips.

* * * * *